United States Patent [19]
Bol

[11] Patent Number: 5,149,397
[45] Date of Patent: Sep. 22, 1992

[54] FABRICATION METHODS FOR MICROMECHANICAL ELEMENTS

[75] Inventor: Igor I. Bol, Sherman Oaks, Calif.

[73] Assignee: Xerox Corporation, Stamford, Conn.

[21] Appl. No.: 725,174

[22] Filed: Jul. 3, 1991

[51] Int. Cl.[5] .................. B44C 1/22; C03C 15/00; C03C 25/06; H01L 21/306

[52] U.S. Cl. .................. 156/657; 156/659.1; 156/662; 156/656

[58] Field of Search ........... 156/653, 656, 657, 659.1, 156/661.1, 662; 310/40 R, 40 MM, 261–268; 437/228, 233, 238, 241, 245

[56] References Cited

U.S. PATENT DOCUMENTS

| | | | |
|---|---|---|---|
| 4,740,410 | 4/1988 | Muller et al. | 156/656 X |
| 4,997,521 | 3/1991 | Howe et al. | 156/655 X |
| 5,043,043 | 8/1991 | Howe et al. | 156/657 X |

Primary Examiner—William A. Powell

[57] ABSTRACT

A process in which concave surfaces to form undercut edges can be made and the application of such process to making micromechanical devices. Concave surfaces forming undercut edges are made in a wall of a stationary structure extending from a planar surface by growing a convex bumper into the wall. The bumper forms a convexo-concave relationship with the wall. The bumper is then removed from the wall in such a manner as to preserve the concave, undercut surface of the wall. The stationary structure and the planar surface is then further processed by coating with a sacrificial layer, and a structural layer. The structural layer is patterned into a movable structure that is held onto the stationary structure by the curved, undercut edge such as the slot in a slider. Final processing includes removing the sacrificial layer to free the movable structure from the stationary structure.

37 Claims, 10 Drawing Sheets

FABRICATION METHODS FOR MICROMECHANICAL ELEMENTS

This application is related to applicant's copending U.S. application Ser. No. 07/725,176 Manufacture of a Suspended Micromechanical Element and Ser. No. 07/725,173 Manufacture of a Micromechanical Element with Two Degrees of Freedom filed concurrently herewith.

BACKGROUND OF INVENTION

This invention relates generally to micromechanical elements, such as movable joints, gears, and sliders and more particularly concerns fabrication methods for making high precision micromechanical elements.

Micromechanical elements with joints that slide or rotate have many uses in miniature pin joints, gears, cranks, slides, and other mechanisms. These elements can be made in a variety of ways. In U.S. Pat. No. 4,740,410 by Muller et al., micromechanical sliding or rotating elements are made by following the process steps of:
1) depositing a sacrificial layer of glass on a substrate,
2) depositing and forming a structural layer of polysilicon for the sliders or gears,
3) depositing a second sacrificial layer of glass,
4) depositing and forming a second structural layer of polysilicon for the rails or pins,
5) removing the sacrificial layers to free the gears and sliders from both the substrate and the pins and rails.

This process results in fixed axle pin joints or fixed rail sliders. Once loosened, the fixed gears and sliders rest on the substrate. In operation, undesirable amounts of friction are generated between the gears and sliders, and the substrate.

A process for making self-constraining joints is also disclosed in Muller et. al. Self-constraining joints may slide and rotate at the same time. These joints are constructed using a small variation of the basic process discussed above. The self-constraining joints are differentiated from the fixed joints by constructing a flange on the pins and rails underneath the gears and sliders to keep them in place. The pins and rails can either be fixed to the substrate or left free to slide across the substrate. The pins and rails are constructed using a portion of the normally first sacrificial glass layer to form the pin or rail and the first structural polysilicon layer to form the flange. The flange is formed with an etch undercut process. Etch undercutting processes are in general not easily controllable. The glass/polysilicon joint is also the weakest part of the structure and tends to break under stress.

Further information about this process can also be found in a paper by Muller et al:
"Integrated Movable Micromechanical Structures for Sensors and Actuators", IEEE Transactions on Electron Devices vol. 35, no. 6, June, 1988.

SUMMARY OF THE INVENTION

Briefly stated and in accordance with the present invention, there is provided a process for making undercut edges and application of that process to making micromechanical elements.

The undercut edge is made using a two step patterning process. The first step is to define the edge or wall to be undercut using conventional photoresist and etching techniques. The second step is to grow a bumper into the edge or wall to be undercut, the bumper forming a convexo-concave relationship with the edge or wall. That is, the bumper will bulge outward into the edge or wall and the edge or wall will bulge inward to accommodate the bumper. The term convexo-concave as used herein shall mean any curve type relationship which could, for instance, be circular, elliptical, etc. The conclusion of this step is removal of the bumper while the edge or wall retains its concave shape. An undercut edge has now been produced.

A first type of sliding or rotating micromechanical element is built on a substrate with a projecting pin or rail and with concave sides built using the convexo-concave, undercutting process described above. Since the sides are concave, the pin or rail is necked. A gear or slider is formed around the pin or rail so that it is restrained from lifting up and off the pin or rail. The gear or slider is formed around the pin or rail by first coating the pin or rail with a relatively uniform sacrificial layer. Then a structural layer is deposited on the sacrificial layer. After a gear or slider is formed out of the structural layer, the sacrificial layer is etched away releasing the gear from the pin or the slider from the rail. By using a sacrificial layer to define the shape of the structural layer, a gear or slider can be built around its pin or rail and will conform to the concave shape of the pin or rail. The gear or slider will be narrower where the pin or rail is narrower and will not be able to move up the wider section and up off the pin or rail.

A second type of gear or slider may also be built with this process. Instead of building a pin which projects outward from the substrate, a hole that projects inward towards the substrate is built. The sides of the hole are concave, again made using the convexo-concave undercutting process described above, therefore the width of the hole is narrower at the top of the hole than the width in the middle of the hole. As in the case of a male gear or slider, a relatively uniform sacrificial layer is provided in the hole and on the surrounding area. A structural layer is then deposited on the sacrificial layer and fabricated into a gear or slider. When the sacrificial layer is removed the gear or slider is free to move within the confines of the hole. Again, by using a sacrificial layer to define the shape of the structural layer, a gear or slider can be built around the hole and will conform to the concave shape of the hole. The gear or slider will be wider where the hole is wider and will not be able to move up the narrower section and out of the hole.

A small process variation results in a cylindrical self-constrained micromechanical element. First, a cylinder is built on a substrate but separated from it by a small layer of nitride. The cylinder is then covered with a relatively uniform sacrificial layer. A structural layer is then deposited on the sacrificial layer and fabricated into a casing around the cylinder. When the sacrificial layer is removed the cylinder is free to both slide and rotate within the casing. Again, by using a sacrificial layer to define the shape of the structural layer, a casing can be built around the cylinder that conforms to the shape of the cylinder.

DESCRIPTION OF THE INVENTION

Figure 1:
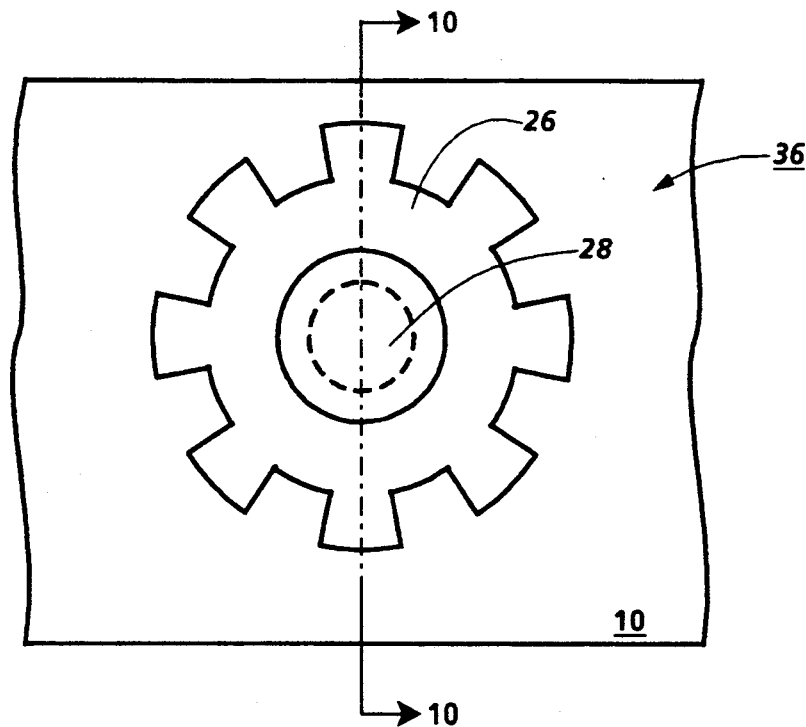
FIG. 1 shows a top view of a gear on a pin.
Figure 2:
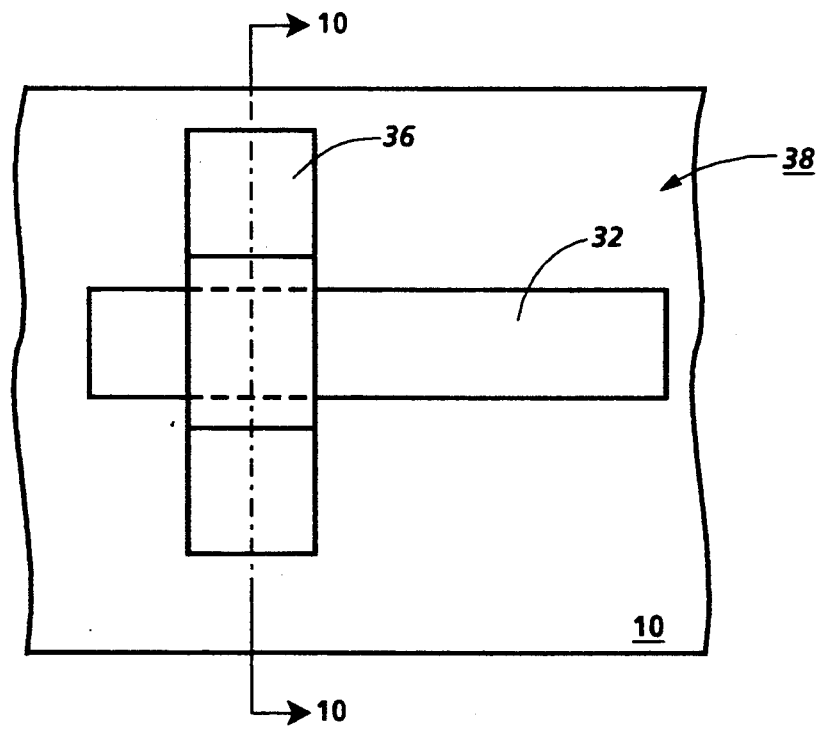
FIG. 2 shows a top view of a slider on a rail.

Turning now to FIG. 1, a top view of a gear 26 rotating around a pin 28 is shown. FIG. 2 depicts a top view of a slider 30 sliding on a rail 32. Both of these structures are built using the same process sequence and have the same cross section as taken through 10—10 and shown in FIG. 10, so they will be described together. All of the process steps for deposition of materials, etching and patterning are known in the art. Therefore, the description will focus on the order and results of each step and not on the specific details required to perform each step.

The micromechanical elements are built upon a substrate. In this embodiment, silicon is used for the substrate. Silicon is ideal since it is not damaged during high temperature process steps. Other materials, such as ceramics or some metals, could be substituted.

Figure 3:
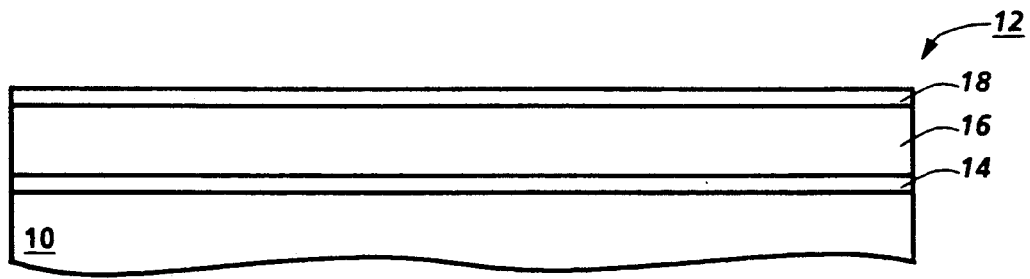
FIG. 3 shows a cross sectional view of a substrate after first and second nitride deposition and doped polysilicon deposition to form a first structural layer.

FIG. 3 illustrates the substrate 10 after depositing a structural layer 12. The structural layer 12 is actually comprised of three layers, a first nitride layer 14, a doped polysilicon layer 16, and a second nitride layer 18.

The structural layer 12 undergoes two phases of patterning. The first is done using a conventional photoresist and etching process. The photoresist is used to define those areas that will become pins and/or rails. Those areas of the structural layer 12 that will not become pins and/or rails are completely etched away. When this step is completed, the remaining structural layer 12 will project or protrude from the surface of the substrate 10 as in FIG. 4. The projecting or protruding remains of the structural layer 12 will later become the pin 28 shown in FIG. 1 or the rail 32 shown in FIG. 2.

Figure 5:
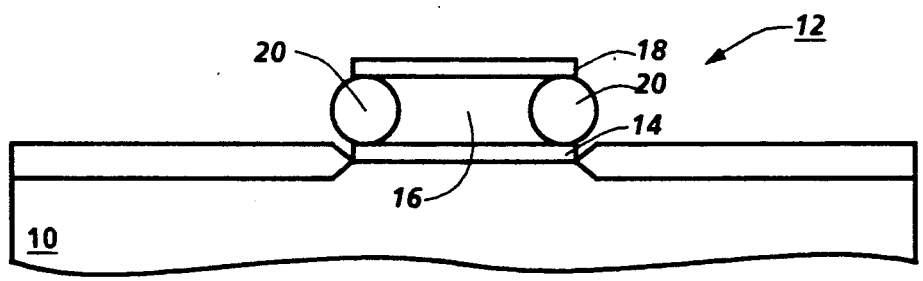
FIG. 5 shows a cross sectional view of the substrate of FIG. 4 after oxide bumpers are grown.

As shown in FIG. 5, the second patterning phase commences with growing oxide bumpers. Oxide bumpers 20 are grown on the doped polysilicon layer 16 using a conventional oxidation process. The oxide grows on the exposed edge or wall of the doped polysilicon layer 16. The oxide bumper 20 grows both inward and outward in a curved shape since the constraints put on it from the first and second nitride layers 14,18 control the shape of the bumper. The oxidation rate will be slowest at the interface of the doped polysilicon layer 16 with each of the nitride layers 14,18. The oxide bumpers 20 are grown until the profile of the oxide growth is convex and forming a convexoconcave relationship with the doped polysilicon layer 16. Oxidation rates can be controlled by changing the dopant profile of the doped polysilicon layer 16 either by ion implantation or by controlling in situ dopant in the doped polysilicon layer 16. Since control of polysilicon oxidation rates is known, the depth and profile of the oxide bumper 20 can be precisely controlled. Therefore, the concave shape of the pin 28 profile shown in FIG. 1 can be precisely controlled. The growth and control of oxide bumpers is discussed in U.S. Pat. Nos. 4,400,866 and 4,375,643 by Bol and Keming, both titled Application of Grown Oxide Bumper Insulators to a High Speed VLSI SASMEFET, incorporated by reference herein.

Figure 6:
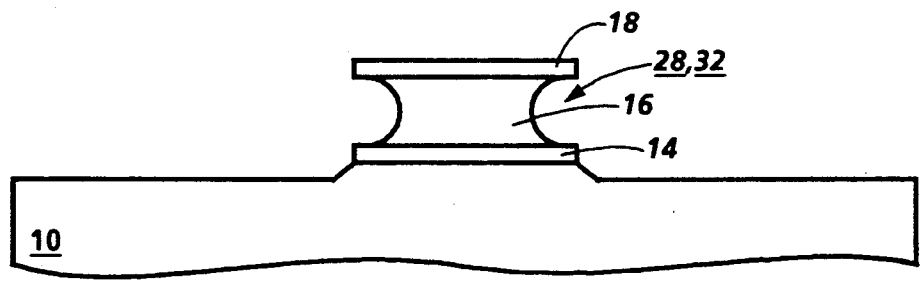
FIG. 6 shows a cross sectional view of the substrate of FIG. 5 after the oxide bumpers have been etched away.

Oxide removal as shown in FIG. 6 is the last step of patterning the first structural layer 12 which has become either the pin 28 or the rail 32 as shown in FIGS. 1 and 2. The convexo-concave relationship of the oxide bumper 20 to the doped polysilicon layer 16 allows construction of a pin 28 or rail 32 with concave sides. Since the oxide bumpers had an convex profile, when they are etched away the resulting wall will have a concave. Any convexo-concave profile, where the oxide bumper 20 bulges outward and the doped polysilicon layer 16 bulges inward, where the head of the pin 28 or rail 32 is larger than the body 31 of the pin 28 or rail 32 will work. Since the pin 28 or rail 32 is wider at the head 29, a gear or slider can be constructed around the pin 28 or rail 32 that will be held on by the head 29 the of the pin 28 or rail 32.

Figure 7:
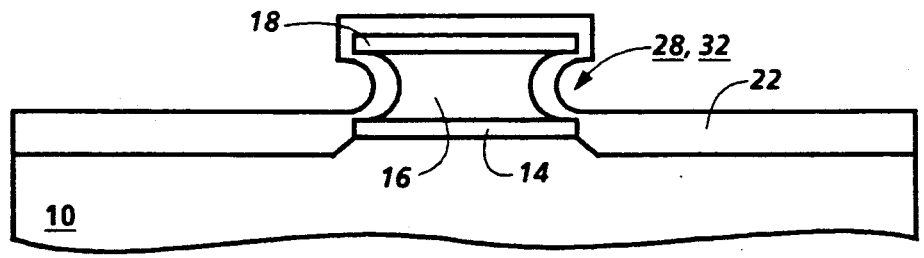
FIG. 7 shows a cross sectional view of the substrate of FIG. 6 after deposition of a sacrifical layer.

The next step is forming the sacrificial layer 22 as shown in FIG. 7. In this embodiment, thermal oxide growth is used to coat the substrate 10 and the surfaces of the pin 28 or rail 32 to form the sacrificial layer 22. However, any material with a sufficiently high etching rate compared to polysilicon that can withstand the temperatures and processing of the further steps and which conforms to the shape of the pin when deposited may be used. Oxide is grown on the surface of the substrate 10 and the sides of the pin 28 or rail 32 which are made from silicon and doped polysilicon respectively. Since the top surface of the pin 28 or rail 32 is nitride, no oxide can be grown there. To insure that the whole structure is covered with oxide, a TEOS oxide deposition is used after oxide has been grown on the substrate 10 and the side surfaces of the pin 28 or rail 32. The result is that the oxide layer on the top surface of the pin 28 or rail 32 is thinner than the oxide layer on the substrate 10 and the sides of the pin 28 or rail 32, as shown in FIG. 7.

Figure 8:
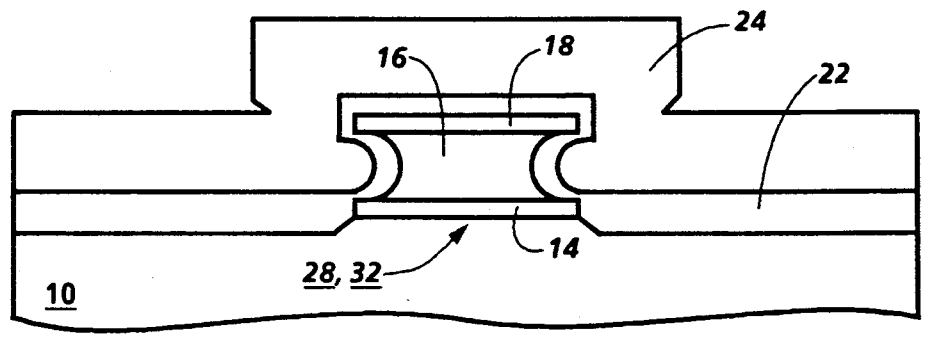
FIG. 8 shows a cross sectional view of the substrate of FIG. 7 after deposition of a second structural layer.

The structure is now ready for formation of the structural layer 24, as shown in FIG. 8. Polysilicon has been used in this embodiment although other materials may be substituted such as silicon, metals, or metal silicides. The structural layer 24 is separated from the pin 28 or the rail 32 and the substrate 10 by the sacrifical layer 22.

Once the structural layer 24 has been deposited it is ready for patterning to be finally formed into either the gear 26 or slider 30 shown in FIGS. 1 and 2. The slider 30, will be slotted to receive the rail 32. Conventional procedures of masking and etching that were used in previous steps to pattern the structural layer 12 are used again here to pattern the structural layer 24.

Figure 9:
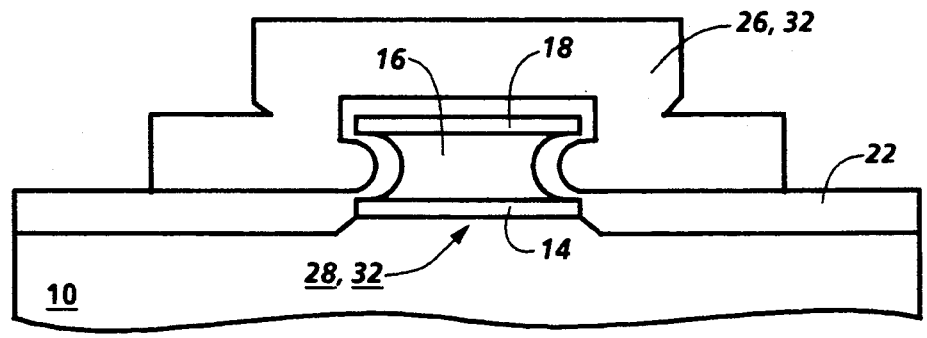
FIG. 9 shows a cross sectional view of the substrate of FIG. 8 after patterning the structural layer.

FIG. 9 shows the device after patterning the structural layer 24. The gear 26 or slider 30 is now completed but still connected by the sacrificial layer 22 to the substrate 10 and the pin 28 or the rail 32.

Figure 10:
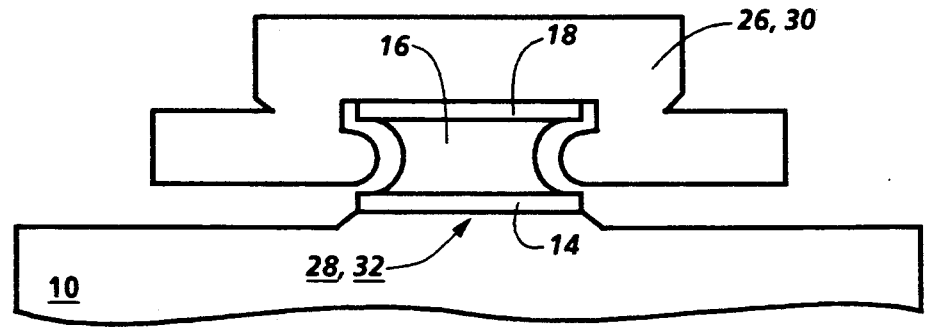
FIG. 10 is a cross sectional view of the completed gear shown in FIG. 1 or the completed slider shown in FIG. 2 taken through section line 10—10.

The final step, shown in FIG. 10, is removal of the sacrificial layer 22. In this embodiment an oxide etch is used to wash out the oxide used for the sacrificial layer 22. This step frees the gear 26 or slider 30 from the pin 28 or rail 32 and the substrate 10. The gear 26 may now rotate freely around the pin 28 and the slider 30 may now slide freely on the rail 32.

Since the sacrificial layer 22 was thicker on the sides of the pin 28 or rail 32 and the substrate 10, when the sacrificial layer 22 is etched away the gear 26 or slider 30 will rest on the pin 28 or rail 32 but will be suspended above the substrate 10 and constrained by, but separated from, the head 29 and body 31 of the pin 28 or rail 32. Having the gear 26 or the slider 30 held suspended above the substrate 10 eliminates the frictional component between the gear 26 and substrate 10 when in use.

Figure 11:
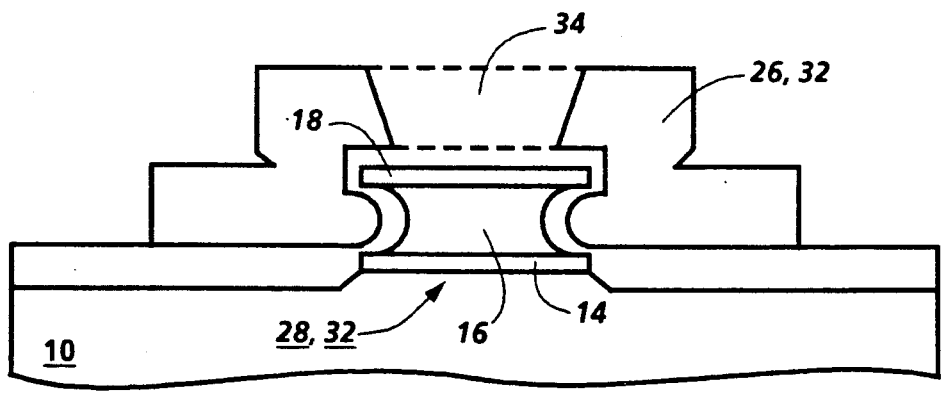
FIG. 11 is a cross sectional view of an alternative process step for FIG. 9.
Figure 12:
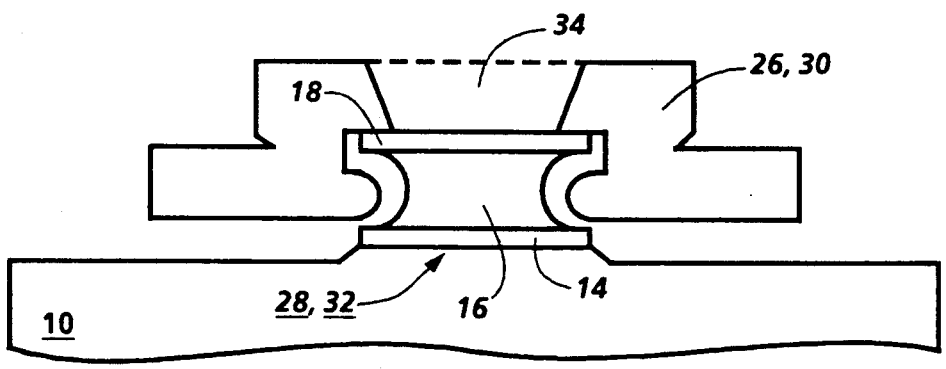
FIG. 12 is a cross section of an alternative gear or slider structure built using the alternative process step shown in FIG. 11.

An alternative method for further reducing the friction of the parts is shown in FIGS. 11 and 12. The steps shown in these Figures replace the steps shown in FIGS. 9 and 10. When patterning the structural layer 24 to form the gear 26 or slider 30, the center portion 34 of the gear 26 or slider 30 may also be removed as is shown in FIG. 11. After the oxide etch to wash out the sacrificial layer 22 is accomplished, the structure then appears as in FIG. 12. The removal of the center portion 34 minimizes contact between the gear 26 or slider 30 and the pin 28 or rail 32, reducing the friction further when the gear 26 or slider 30 is in use.

Since silicon is capable of oxidation, it is possible to provide a thicker sacrificial layer on the substrate than on the top of the pin 28 or rail 32 to produce a gear or slider that is suspended above the substrate. A second embodiment may also be built and is shown in FIGS. 13-20. Equivalent parts of FIGS. 3-10 are given the same numbers only with "a" affixed thereto. The sequence will also be used to illustrate changes to the process when a substrate that does not form an oxide is used.

Figure 13:
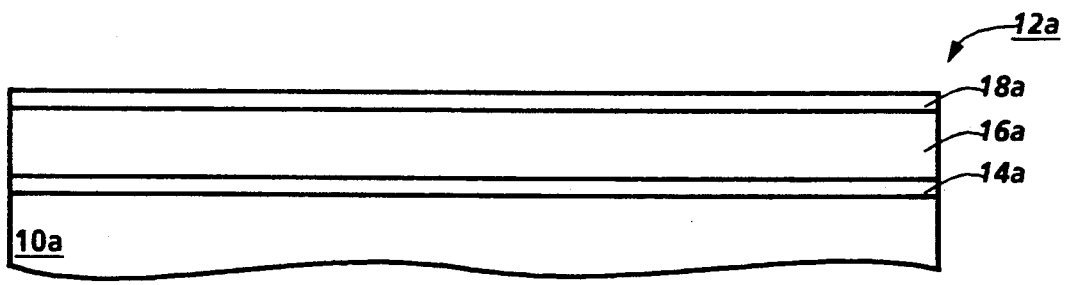
FIG. 13 shows a cross sectional view of a substrate after first and second nitride deposition and doped polysilicon deposition to form a first structural layer.

FIG. 13 is identical to FIG. 3 in that it illustrates the substrate after deposition of the structural layer 12a which will be patterned to form the recessed pins and-/or rails.

Figure 14:
FIG. 14 shows a cross sectional view of the substrate of FIG. 13 after masking and etching the first structural layer.

FIG. 14 illustrates the first patterning phase. In contrast to FIG. 4, a depression has been defined in the first structural layer. However, the nitride layer 14a has been left on the surface of the substrate 10a. There is no reason to remove the nitride layer 14a since in this embodiment the surface of the substrate 10a is not does not form an oxide. This hole will later become the recessed pin or rail.

Figure 15:
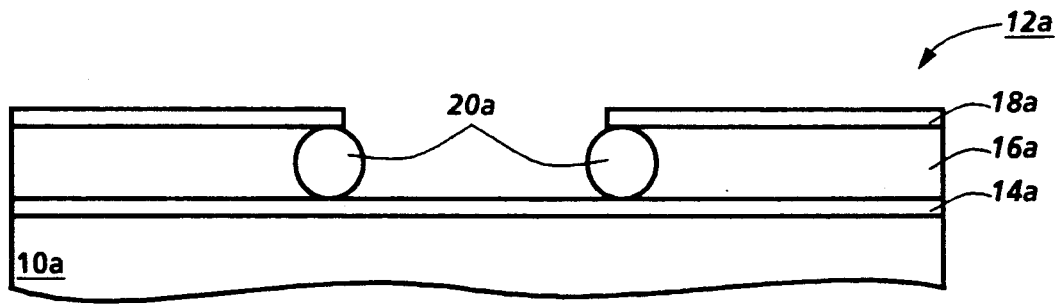
FIG. 15 shows a cross sectional view of the substrate of FIG. 14 after oxide bumpers are grown.
Figure 16:
FIG. 16 shows a cross sectional view of the substrate of FIG. 15 after the oxide bumpers have been etched away.

Oxide bumpers are grown and removed in FIGS. 15 and 16 identically as in FIGS. 5 and 6. The result is a recessed pin 28a or rail 32a formed by the hole in the first structural layer 12a.

Figure 17:
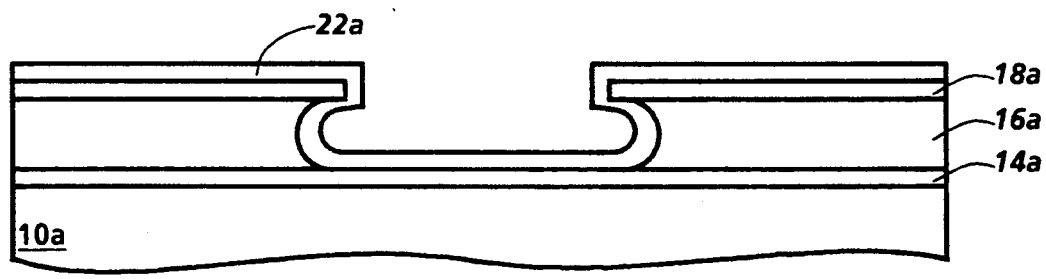
FIG. 17 shows a cross sectional view of the substrate of FIG. 16 after deposition of a sacrificial layer.

The next step is covering the recessed pins 28a and-/or rails 32a with a sacrificial layer 22a as shown in FIG. 17. In FIG. 7 a two step process of first growing oxide on the substrate and then depositing additional material was used. In this embodiment, only a TEOS oxide deposition is used to insure that the nitride surfaces of the recessed pin 28a or recessed rail 32a are covered and because TEOS oxide deposition is a conformal deposition process. Since the substrate does not oxidize, there is no reason to perform the step of oxidizing the surface of the substrate 10a as in the first embodiment.

Figure 18:
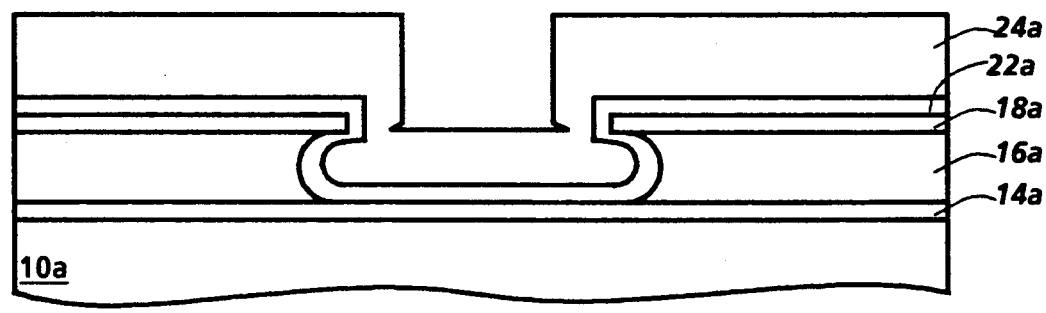
FIG. 18 shows a cross sectional view of the substrate of FIG. 17 after deposition of a second structural layer.
Figure 19:
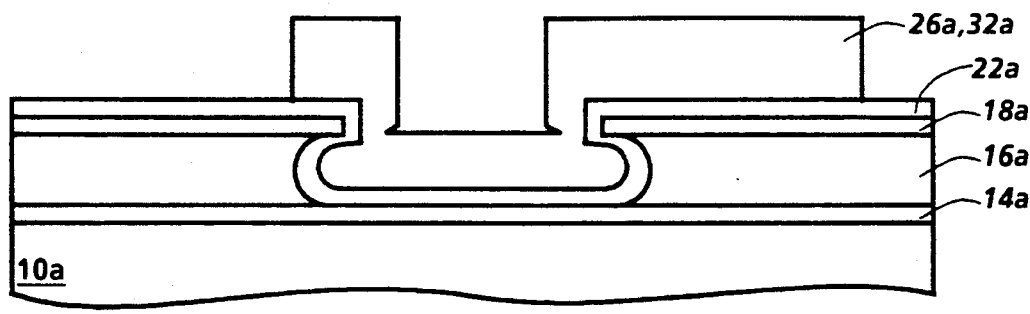
FIG. 19 shows a cross sectional view of the substrate of FIG. 18 after patterning the structural layer.

Deposition and patterning of the second structural layer 24a, as shown in FIGS. 18 and 19 is identical to FIGS. 8 and 9.

Figure 20:
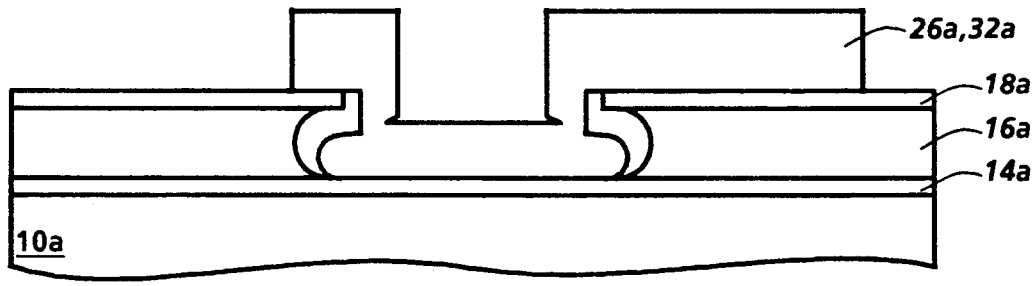
FIG. 20 is a cross sectional view of a completed gear from the sequence of process steps shown in FIGS. 13-19.

The final step, shown in FIG. 20, is an oxide etch to wash out the sacrificial layer 22a. This step frees the gear 26a or slider 30a from the recessed pin 28a or recessed rail 32a and the substrate 10a. The gear 26a may now rotate freely around the recessed pin 28a and the slider 30a may now slide freely on the recessed rail 32a. However, due to the single step process of depositing a sacrificial layer the gear 28a or slider 32a is not suspended above the substrate as in the previous sequence.

Other variations of the process are also contemplated including eliminating the nitride layer 14 and patterning and etching the substrate 10 itself to form the structures formed from the first structural layer 12,12a.

FIGS. 21-24 illustrate the changes in the process described in FIGS. 3-6 when the nitride layer 14 has been eliminated. Equivalent parts of FIGS. 3-6 are given the same reference numbers only with "b" affixed thereto. The steps shown in FIGS. 7-10 will follow the process steps shown in FIG. 21-24 to complete the formation of the micromechanical element.

Figure 21:
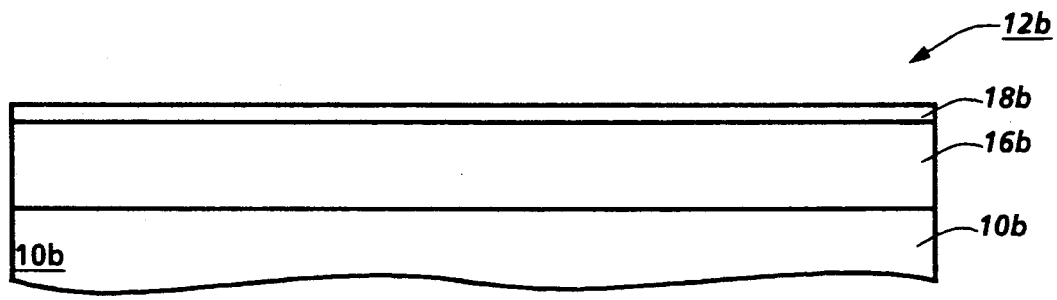
FIG. 21 shows a cross sectional view of a substrate after nitride deposition and doped polysilicon deposition to form a first structural layer.

FIG. 21 illustrates the substrate 10b after the deposition of the first structural layer 12b. The first structural layer 12b comprises of two layers, a doped polysilicon layer 16b and a nitride layer 18b.

Figure 22:
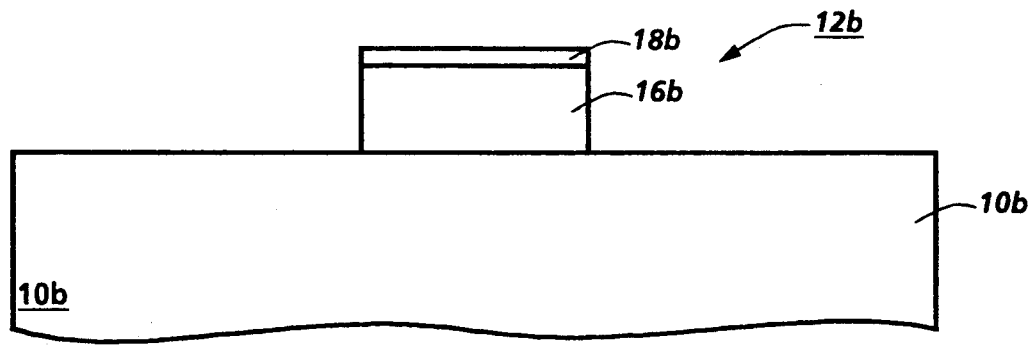
FIG. 22 shows a cross sectional view of the substrate of FIG. 21 after masking and etching the first structural layer.

FIG. 22 illustrates the first patterning step of the first structural layer 12b. It is similar in all respects to the patterning shown in FIG. 4.

Figure 23:
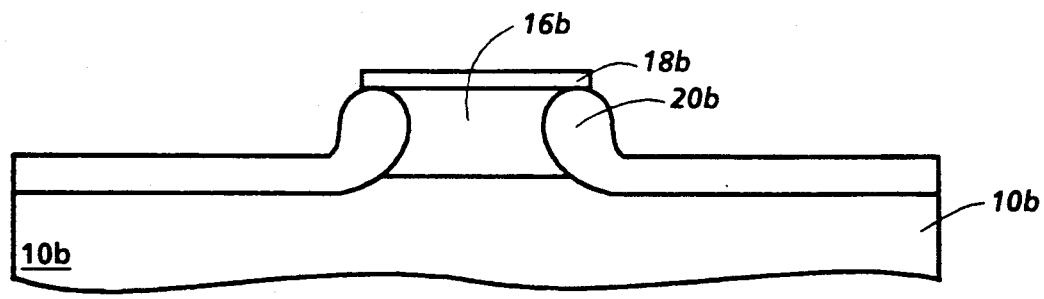
FIG. 23 shows a cross sectional view of the substrate of FIG. 22 after oxide bumpers are grown.

FIG. 23 illustrates the growth of the oxide bumpers 20b to achieve the curved sides of first structural layer 12b. Unlike FIG. 5, the oxide bumpers 20b do not grow in an approximately circular shape but still form a convexo-concave relationship with the doped polysilicon layer 16b. The growth of the oxide bumpers 20b is merged with the oxide growth on the surface of the substrate 10b since the nitride layer between the doped polysilicon 16b and the substrate 10b was never deposited and therefore does not separate the oxide bumpers 20b from the oxide growth on the surface of the substrate, as in the first embodiment. The resultant oxide bumper growth is relatively flat with a convex bump grown into the doped polysilicon layer 16b.

Figure 24:
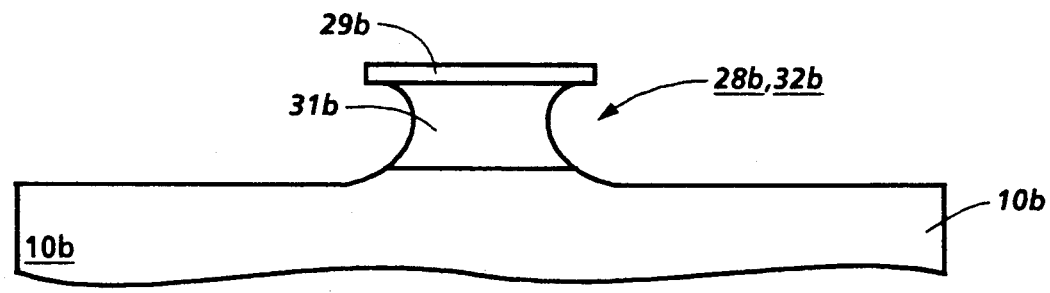
FIG. 24 shows a cross sectional view of the substrate of FIG. 23 after the oxide bumpers have been etched away.

FIG. 24 illustrates the pin 28b or rail 32b after the oxide has been removed. Even though the oxide bumpers were only partially circular, enough circular shape remains to insure that the head 29b of the pin 28b or rail 32b is still larger than the body 31b of the pin 28b or rail 32b.

The processing steps from this point forward are identical to those illustrated in FIGS. 7-10.

Figure 4:
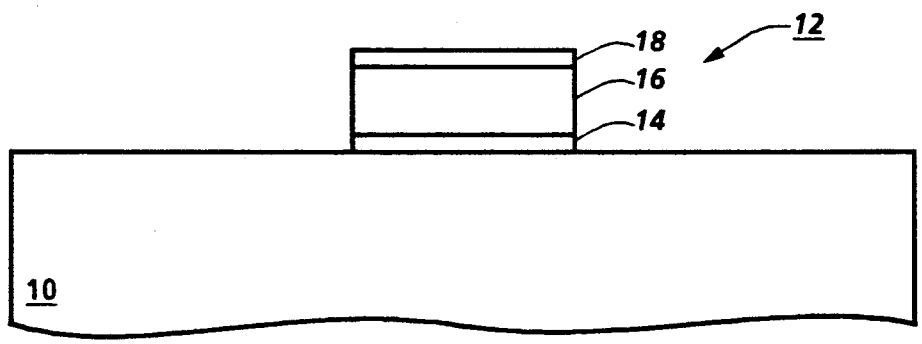
FIG. 4 shows a cross sectional view of the substrate of FIG. 3 after masking and etching the first structural layer.
Figure 25:
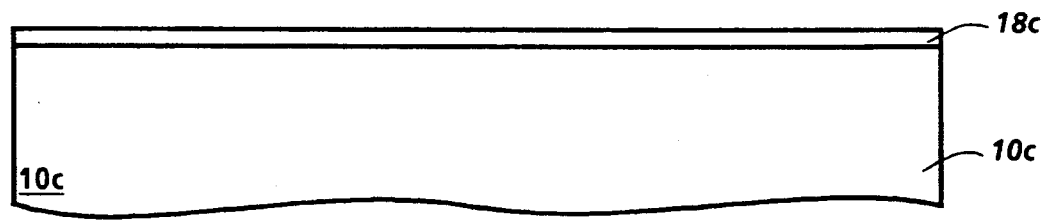
FIG. 25 shows a cross sectional view of a substrate after nitride deposition.
Figure 26:
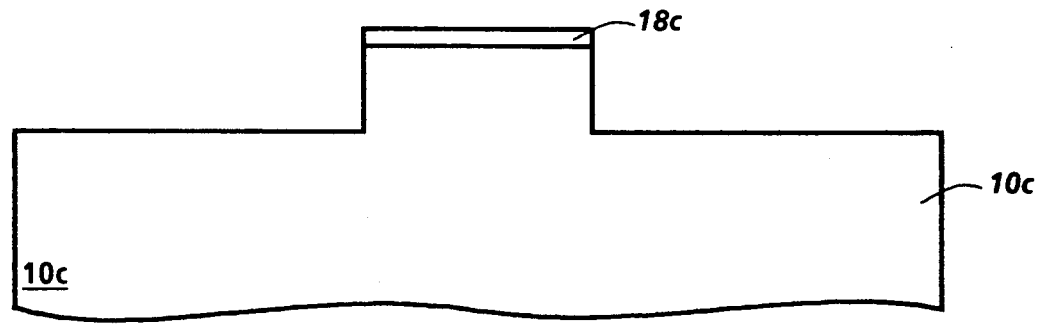
FIG. 26 shows a cross-sectional view of the substrate of FIG. 25 after masking and etching to form a protruding structure.

FIGS. 25 and 26 illustrate the changes in the process described in FIGS. 3 and 4 when both the nitride layer 14 and the polysilicon layer 16 have both been eliminated. Equivalent parts of FIGS. 3 and 4 are given the same numbers only with "c" following. The same steps shown in FIGS. 23 and 24 and FIGS. 7-10 will follow the process steps shown in FIGS. 25 and 26 to complete the formation of the micromechanical element. The pin 28c or rail 32c is constructed out of the silicon substrate and has no joints. The entire concave profile that provides for the head 29c to be larger than the body 31c of the pin 28c or rail 32c is located in the doped polysilicon layer 16c only. This is different from the prior art as described in the patent to Muller et al. Muller et al. constructs his pins and flanges out of two different layers that are apt to separate under stress unlike this construction.

FIG. 25 shows preparation of the substrate before it is to be patterned to form pins and rails. A nitride layer 18c is deposited on the substrate.

FIG. 26 shows the substrate after the first phase of patterning. A protruding structure with a nitride cap 18c is etched out of the substrate in the same manner as the first structural layer 12 in FIG. 4.

The next two steps are identical to those in FIGS. 23 and 24, and the concluding steps are identical to those in FIGS. 7-10.

Utilizing layers of gears and sliders allows complicated micromechanical structures with interlocking gears and sliders to be built. Self-constraining structures, based on sliding gears interacting with other gears or sliders, can be built.

A second type of self-constraining joint can be built using a small variation of this process. This self-constraining joint is a rod or cylindrical structure that may slide and/or rotate within a casing.

Figure 27:
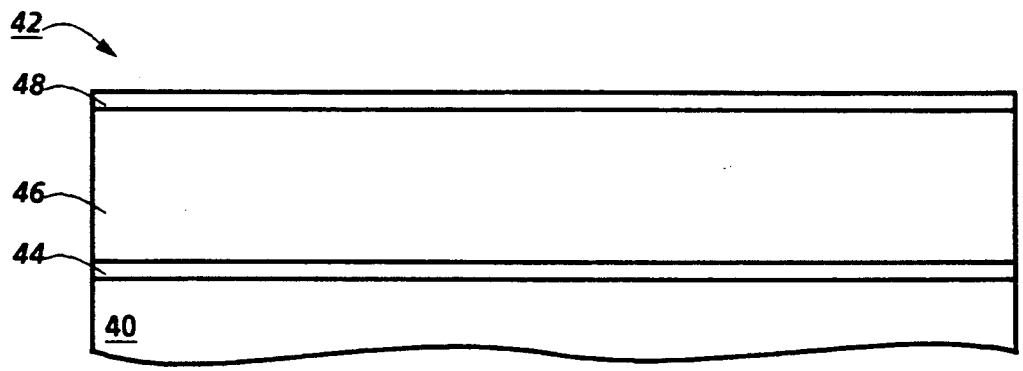
FIG. 27 shows a cross sectional view of a substrate after first and second nitride deposition and doped polysilicon deposition.

The micromechanical elements are built upon a substrate 40. In this embodiment, silicon is used for the substrate 40, although other semiconductor materials are equally appropriate. FIG. 27 illustrates the substrate 40 after depositing the first structural layer 42. The first structural layer 42 comprises of three layers, a first nitride layer 44, a doped polysilicon layer 46, and a second nitride layer 48.

Figure 28:
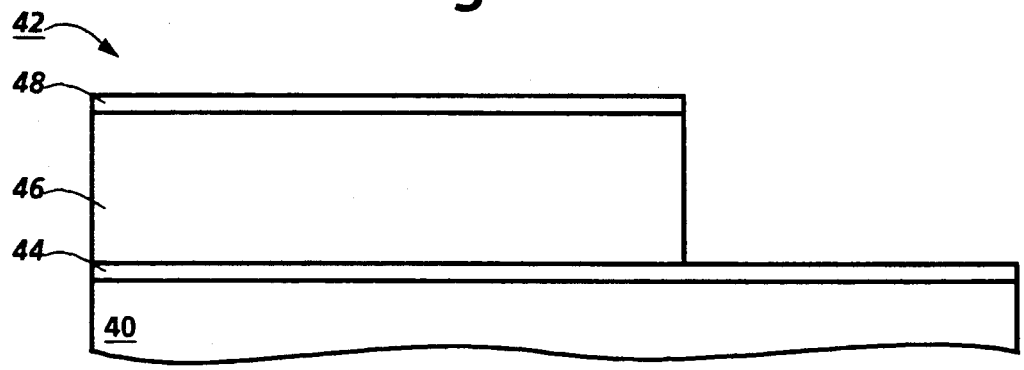
FIG. 28 shows a cross sectional view of the substrate of FIG. 27 after masking and etching the second nitride layer and the doped polysilicon layer.

The first structural layer 42 undergoes two phases of patterning. The first step is done using conventional photoresist and etching processes and the results are shown in FIG. 28. When this step is completed, the remaining first structural layer 42 will define where the self-constrained structure will be on the substrate 40.

The second patterning phase is oxidation. An oxide bumper 50 is grown on the doped polysilicon layer 46 using a conventional oxidation process. Since the control of polysilicon oxidation rates is known, the size and shape of the oxide bumper can be precisely controlled.

Figure 29:
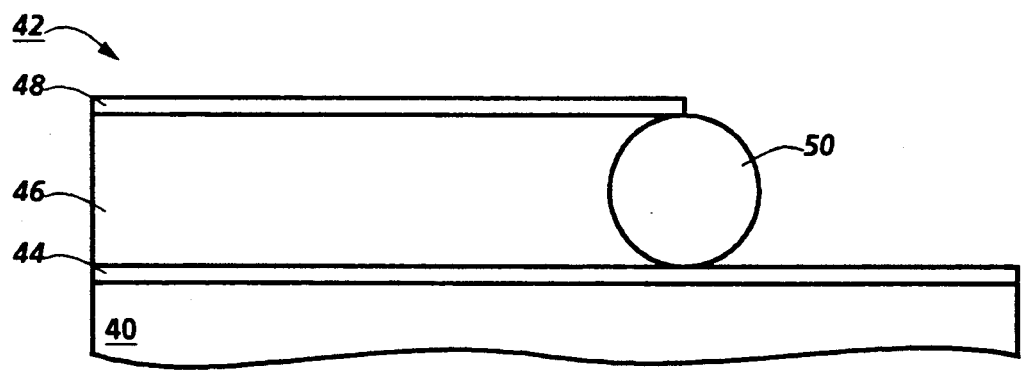
FIG. 29 shows a cross sectional view of the substrate of FIG. 28 after an oxide bumper is grown.

The oxide bumper is grown as shown in FIG. 29. The first nitride layer 44 and the second nitride layer 48 have defined what portion of the doped polysilicon layer 46 is open for oxidation and contribute to the shape of the oxide bumper 50. In this sequence, attainment of a near circular oxide bumper is important.

Figure 30:
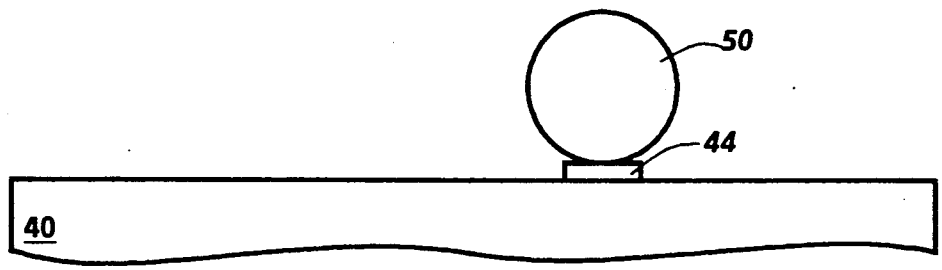
FIG. 30 shows a cross sectional view of the substrate of FIG. 29 after the first and second nitride layers and the doped polysilicon layer has been etched.

Unlike the previous sequence, where oxide removal completes the patterning process, the remains of the first structural layer 42 are removed and the oxide bumper 50 remains. The oxide bumper 50 will become a rod that can move inside a casing. The first nitride layer 44 is not completely removed in this step. A portion between the oxide bumper 50 and the substrate 40 remains as shown in FIG. 30.

Figure 31:
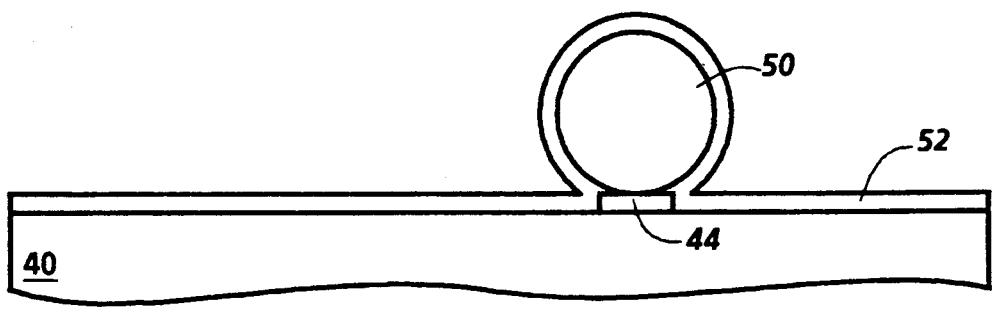
FIG. 31 shows a cross sectional view of the substrate of FIG. 30 after deposition of a sacrificial layer.
Figure 32:
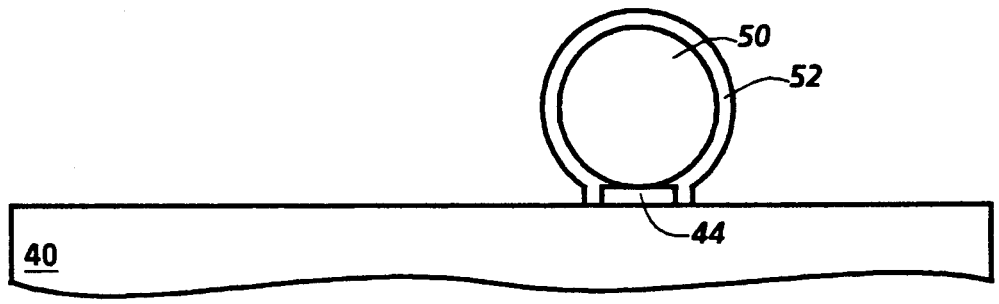
FIG. 32 shows a cross sectional view of the substrate of FIG. 31 after the sacrificial layer has been patterned.

The next step is covering the oxide bumper 50 with a sacrificial nitride layer 52 as shown in FIG. 31. In this embodiment a nitride layer is deposited by conventional means. The nitride is then patterned using the same photoresist and etching technique used to pattern the first structural layer 42 in FIG. 28. The excess nitride is removed and the result is shown in FIG. 32.

Figure 33:
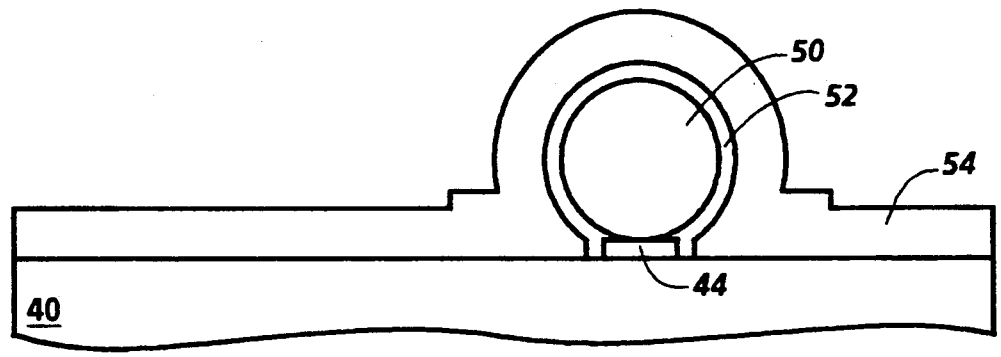
FIG. 33 shows a cross sectional view of the substrate of FIG. 32 after deposition of a structural layer.

The structure is now ready for deposition of the second structural layer 54, as shown in FIG. 33. Polysilicon has been used in this embodiment although other materials are also appropriate. Notice that the second structural layer 54 is separated from the oxide bumper 50 by the sacrificial layer 52.

Figure 34:
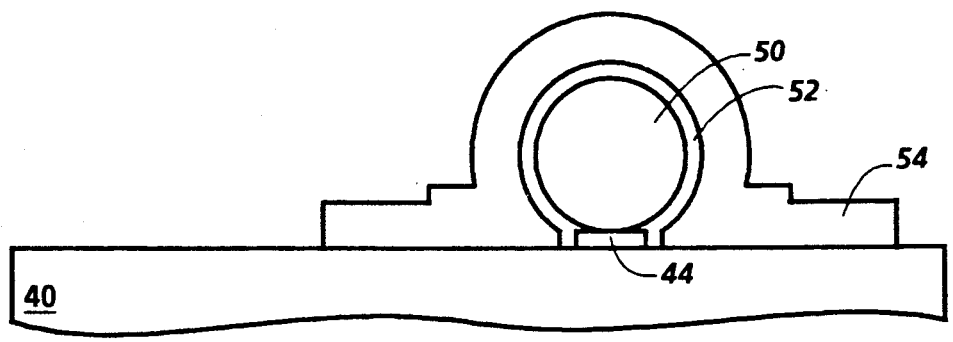
FIG. 34 shows a cross sectional view of the substrate of FIG. 33 after patterning the structural layer.

Once the second structural layer 54 has been deposited it is ready for patterning. Polysilicon is easily patterned by the conventional procedures of masking and etching that were used in previous steps to pattern the first structural layer 42 and the sacrificial layer 52. FIG. 34 shows the device after patterning the second structural layer 54. A rod 56 that can slide or rotate in a casing 58 has been finished except for the etching away of the sacrificial layer 52.

Figure 35:
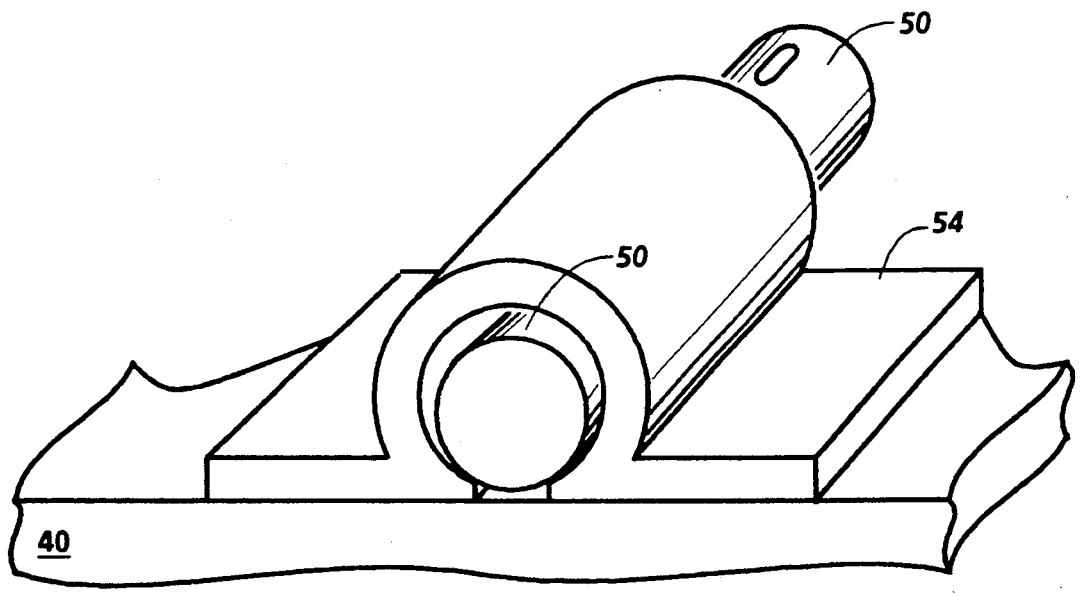
FIG. 35 shows an overhead view of a cylinder that slides in a casing as a result of the process steps shown in FIGS. 27-34.

The final step, shown in FIG. 35, is a nitride etch to wash out the sacrificial layer 52. This step frees the rod 56 from its casing 58 and the substrate 40.

While the present invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

What is claimed is:

1. A process for making an concave surface comprising;
   providing a member having a generally planar surface with wall means extending from said surface,
   growing bumper means into said wall means and forming a convexo-concave relationship with said wall means,
   removing said bumper means from said wall means such that said wall means retains the concave shape.

2. The process in claim 1 wherein said member includes a second generally planar surface and said wall means is provided by:
   masking and etching said second generally planar surface and said member to expose said first named generally planar surface of said member and to form a structure protruding from said first named generally planar surface of said member, said wall means being located on said protruding structure.

3. The process in claim 2 wherein said bumper means is oxide.

4. The process in claim 2 wherein said wall means is annular.

5. The process in claim 2 wherein said protruding structure is elongated and said wall means is elongated and comprises two walls on opposite sides of said protruding structure.

6. The process in claim 1 wherein said member includes a second generally planar surface and said wall means is provided by:
   masking and etching said second generally planar surface and said member to expose said first named generally planar surface of said member and to form a depression in said member which is defined by wall means and said first named generally planar surface.

7. The process in claim 6 wherein said wall means is annular.

8. The process in claim 6 wherein said wall means is elongated.

9. The process in claim 6 wherein said bumper means is oxide.

10. The process in claim 1 wherein said member is a silicon wafer and said wall means is provided by:
    forming a nitride layer on a silicon wafer, and
    masking and etching said silicon wafer and said nitride layer to expose at least a portion of said generally planar surface and to form a structure of said silicon wafer and said nitride layer which protrudes from said exposed portion of said generally planar surface, said wall means being located on the protruding structure.

11. The process in claim 1 wherein said member is a silicon wafer and said wall means is provided by:
    forming a nitride layer on a silicon wafer, and
    masking and etching said silicon wafer and said nitride layer to expose at least a portion of said generally planar surface and to form a depression in said silicon wafer which is defined by said wall means and said exposed portion of said generally planar surface.

12. The process in claim 1 wherein said wall means is provided by:
    forming a polysilicon layer on said generally planar surface,
    forming a nitride layer on said polysilicon layer, and
    masking and etching said polysilicon layer and said nitride layer to expose at least a portion of said generally planar surface and to form a structure of said polysilicon layer and said nitride layer which protrudes from said exposed portion of said generally planar surface, said wall means being located on the protruding structure.

13. The process in claim 1 wherein said wall means is provided by:
    forming a polysilicon layer on said member,
    forming a nitride layer on said polysilicon layer, and
    masking and etching said polysilicon layer and said nitride layer to expose at least a portion of said generally planar surface and to form a depression in said polysilicon layer and said nitride layer which is defined by said wall means and said exposed portion of said generally planar surface.

14. The process in claim 1 wherein said member includes a first nitride layer which is said generally planar surface and said wall means is provided by:
    forming a polysilicon layer on said first nitride layer,
    forming a second nitride layer on said polysilicon layer, and
    masking and etching said second nitride layer and said polysilicon layer to expose at least a portion of said first nitride layer and to form a structure of said second nitride layer and said polysilicon layer which protrudes from said exposed portion of said first nitride layer, said wall means being located on the protruding structure.

15. The process in claim 1 wherein said member includes a first nitride layer which is said generally planar surface and said wall means is provided by:
    forming a polysilicon layer on said first nitride layer,
    forming a second nitride layer on said polysilicon layer, and
    masking and etching said second nitride layer and said polysilicon layer to expose at least a portion of said first nitride layer and to form a depression in said second nitride layer and said polysilicon layer which is defined by said wall means and said exposed portion of said first nitride layer.

16. The process in claim 1 wherein said wall means is provided by:
    forming a first nitride layer on said member,
    forming a polysilicon layer on said first nitride layer,
    forming a second nitride layer on said polysilicon layer, and
    masking and etching said first nitride layer, said polysilicon layer, and said second nitride layer to to expose at least a portion of said generally planar surface to form a structure of said first nitride layer, said polysilicon layer, and said second nitride layer which protrudes from said exposed portion of said generally planar surface, said wall means being located on the protruding structure.

17. The process in claim 1 wherein said wall means is provided by
    forming a first nitride layer on said member, forming a polysilicon layer on said first nitride layer,
forming a second nitride layer on said polysilicon layer, and
masking and etching said first nitride layer, said polysilicon layer, and said second nitride layer to expose at least a portion of said generally planar surface and to form a depression in said first nitride layer, said polysilicon layer, and said second nitride layer which is defined by said wall means and said exposed portion of said generally planar surface.

18. A process for making micromechanical structures comprising;
providing a member having a generally planar surface with wall means extending from said surface,
growing bumper means into said wall means and forming a convexo-concave relationship with said wall means,
removing one of said means from the other of said means such that the remaining means is attached to said member,
forming a sacrificial layer on at least a portion of at least said remaining means,
forming a structural layer on at least a portion of said sacrificial layer,
patterning said structural layer,
removing said sacrificial layer such that said remaining means and said patterned structural layer are movable relative to each other.

19. The process in claim 18 wherein said member includes a second generally planar surface and said wall means is provided by:
masking and etching said second generally planar surface and said member to expose said first named generally planar surface of said member and to form a structure protruding from said first named generally planar surface of said member, said wall means being located on said protruding structure.

20. The process in claim 19 wherein said bumper means is oxide.

21. The process in claim 19 wherein said sacrificial layer comprises one of silicon oxide or silicon nitride and said structural layer comprises one of polysilicon, silicon nitride, metal silicide, or metal.

22. The process in claim 19 wherein said wall means is annular and said structural layer has an annular recessed cavity receiving said protruding structure.

23. The process in claim 19 wherein said protruding structure is elongated and said wall means is elongated and said structural layer has a slot receiving said protruding structure.

24. The process in claim 18 wherein said member includes a second generally planar surface and said wall means is provided by:
masking and etching said second generally planar surface and said member to expose said first named generally planar surface of said member and to form a depression in said member which is defined by wall means and said first named generally planar surface.

25. The process in claim 24 wherein said bumper means is oxide.

26. The process in claim 24 wherein said wall means is annular.

27. The process in claim 24 wherein said wall means is elongated.

28. The process in claim 18 wherein said step of removing one of said means from the other of said means such that the remaining means is attached to said member comprises removing said bumper means from said wall means.

29. The process in claim 18 wherein said step of removing one of said means from the other of said means such that the remaining means is attached to said member comprises removing said wall means from said bumper means.

30. A process for making a micromechanical device upon a substrate, comprising:
providing a substrate;
forming a first nitride layer upon said substrate;
forming a doped polysilicon layer upon said first nitride layer;
forming a second nitride layer upon said doped polysilicon layer;
masking and etching said second nitride layer and said doped polysilicon layer to expose at least a portion of said first nitride layer and to form a structure with at least one wall means protruding from said exposed portion of said first nitride layer;
growing oxide bumper means into said wall means of said protruding structure and forming a convexo-concave relationship with said wall means;
etching said oxide bumper to remove the same from said wall means of said protruding structure while retaining the concave surface of said wall means;
forming a sacrificial layer on at least a portion of said exposed portion of said first nitride layer and said protruding structure;
forming a structural layer on at least a portion of said sacrificial layer;
patterning said structural layer to form a moving structure for movement relative to said protruding structure and exposing portions of said sacrificial layer; and
etching said sacrificial layer to release said moving structure from said protruding structure and providing for relative movement between said moving structure and said protruding structure.

31. A process for making a micromechanical device upon a substrate, comprising:
providing a substrate;
forming a first nitride layer upon said substrate;
forming a doped polysilicon layer upon said first nitride layer;
forming a second nitride layer upon said doped polysilicon layer;
masking and etching said second nitride layer, said doped polysilicon layer and said first nitride layer to expose at least a portion of said substrate and to form a substrate with at least one wall means protruding from said exposed portion of said substrate;
growing oxide bumper means into said wall means of said protruding structure and forming a convexo-concave relationship with said wall means;
etching said oxide bumper to remove the same from said wall means of said protruding structure while retaining the concave surface of said wall means;
forming a sacrificial layer on said at least a portion of exposed portion of said substrate and said protruding structure;
forming a structural layer on at least a portion of said sacrificial layer;
patterning said structural layer to form a moving structure for movement relative to said protruding structure and exposing portions of said sacrificial layer; and etching said sacrificial layer to release said moving structure from said protruding structure and providing for relative movement between said moving structure and said protruding structure.

32. A process for making a micromechanical device upon a substrate, comprising:
providing a substrate;
forming a doped polysilicon layer upon said substrate;
forming a nitride layer upon said doped polysilicon layer;
masking and etching said doped polysilicon layer and said nitride layer to expose at least a portion of said substrate and to form a structure with at least one wall means protruding from said exposed portion of said substrate;
growing oxide bumper means into said wall means of said protruding structure and forming a convexo-concave relationship with said wall means;
etching said oxide bumper to remove the same from said wall means of said protruding structure while retaining the concave surface of said wall means;
forming a sacrificial layer on at least a portion of said exposed portion of said substrate and said protruding structure;
forming a structural layer on at least a portion of said sacrificial layer;
patterning said structural layer to form a moving structure for movement relative to said protruding structure and exposing portions of said sacrificial layer; and
etching said sacrificial layer to release said moving structure from said protruding structure and providing for relative movement between said moving structure and said protruding structure.

33. A process for making a micromechanical device upon a substrate, comprising:
providing a substrate;
forming a a nitride layer upon said substrate;
masking and etching said nitride layer and the substrate to expose at least a portion of said substrate and to form a structure with at least one wall means protruding from said exposed portion of said substrate;
growing oxide bumper means into said wall means of said protruding structure and forming a convexo-concave relationship with said wall means;
etching said oxide bumper to remove the same from said wall means of said protruding structure while retaining the concave surface of said wall means;
forming a scarificial layer on at least a portion of said exposed portion of said substrate and said protruding structure;
forming a structural layer on at least a portion of said sacrifical layer;
patterning said structural layer to form a moving structure for movement relative protruding structure and exposing portions of said sacrificial layer; and
etching said sacrificial layer to release said moving structure from said protruding structure and providing for relative movement between said moving structure and said protruding structure.

34. A process for making a micromechanical device upon a substrate, comprising:
providing a substrate;
forming a first nitride layer upon said substrate;
forming a doped polysilicon layer upon said first nitride layer;
forming a second nitride layer upon said doped polysilicon layer;
masking and etching said second nitride layer and said doped polysilicon layer to expose at least a portion of said first nitride layer and to form a depression in said second nitride layer and said doped polysilicon layer which is defined by wall means and said exposed first nitride layer;
growing oxide bumper means into said wall means of said depression and forming a convexo-concave relationship with said wall means;
etching said oxide bumper to remove the same from said wall means of said depression while retaining the concave surface of said wall means;
forming a sacrificial layer on said exposed portion of said first nitride layer, said wall means and at least a portion of the remaining portion of said second nitride layer;
forming a structural layer on at least a portion of said sacrificial layer;
patterning said structural layer to form a moving structure for movement relative to a structure forming said depression and exposing portions of said sacrificial layer; and
etching said sacrificial layer to release said moving structure from said structure forming the derpession and providing for relative movement therebetween.

35. A process for making a micromechanical device upon a substrate, comprising:
providing a substrate;
forming a first nitride layer upon said substrate;
forming a doped polysilicon layer upon said first nitride layer; forming a second nitride layer upon said doped polysilicon layer;
masking and etching said second nitride layer, said doped polysilicon layer, and said first nitride layer to expose at least a portion of said substrate and to form a depression in said second nitride layer, said doped polysilicon layer and said first nitride layer which is defined by wall means and said exposed portion of said substrate;
growing oxide bumper means into said wall means of said depression and forming a convexo-concave relationship with said wall means;
etching said oxide bumper to remove the same from said wall means of said depression while retaining the concave surface of said wall means;
forming a sacrificial layer on said exposed portion of said substrate, said wall means and at least a portion of the remaining portion of said second nitride layer;
forming a structural layer on at least a portion of said sacrificial layer;
patterning said structural layer to form a moving structure for movement relative to a structure forming said depression and exposing portions of said sacrificial layer; and
etching said sacrificial layer to release said moving structure from said structure forming the depression and providing for relative movement therebetween.

36. A process for making a micromechanical device upon a substrate, comprising:
providing a substrate;

forming a doped polysilicon layer upon said substrate;

forming a nitride layer upon said doped polysilicon layer;

masking and etching said nitride layer and said doped polysilicon layer to expose at least a portion of the substrate and to form a depression in said nitride layer and said doped polysilicon layer which is defined by wall means and said exposed portion of said substrate;

growing oxide bumper means into said wall means of said depression and forming a convexo-concave relationship with said wall means;

etching said oxide bumper to remove the same from said wall means of said depression while retaining the concave surface of said wall means of said depression while retaining the concave surface of said wall means;

forming a sacrificial layer on said exposed portion of said substrate, said wall means and at least a portion of the remaining portion of said nitride layer;

forming a structural layer on said at least a portion of sacrifical layer;

patterning said structural layer to form a moving structure for movement relative to a structure forming said depression and exposing portions of said sacrificial layer; and etching said sacrtificial layer to release said moving structure from said structure forming the depression and providing for relative movement therebetween.

37. A process for making a micromechanical device on a substrate, comprising:

forming a nitride layer upon the substrate;

masking and etching said nitride layer and said substrate to expose at least a portion of said substrate and to form a depression in said nitride layer and the substrate which is defined by wall means and said exposed portion of said substrate;

growing oxide bumper means into said wall means of said depression and forming a convexo-concave relationship with said wall means;

etching said oxide bumper to remove the same from said wall means of said depression while retaining the concave surface of said wall means;

forming a sacrificial layer on said exposed portion of said substrate, said wall means and at least a portion of the remaining portion of said nitride layer;

forming a structural layer on at least a portion of said sacrificial layer;

patterning said structural layer to form a moving structure for movement relative to a structure forming said depression and exposing portions of said sacrificial layer; and etching said sacrificial layer to release said moving structure from said structure forming the depression and providing for relative movement therebetween.

* * * * *